(12) United States Patent
Khessib (10) Patent No.: US 11,474,949 B2
(45) Date of Patent: Oct. 18, 2022

(54) PHYSICAL MEMORY COMPRESSION

(71) Applicant: Microsoft Technology Licensing, LLC, Redmond, WA (US)

(72) Inventor: Badriddine Khessib, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 16/910,914

(22) Filed: Jun. 24, 2020

(65) Prior Publication Data

US 2021/0311881 A1  Oct. 7, 2021

Related U.S. Application Data

(60) Provisional application No. 63/004,976, filed on Apr. 3, 2020.

(51) Int. Cl.
*G06F 12/10* (2016.01)
*G06F 12/1009* (2016.01)
*G06F 12/1027* (2016.01)
*H03M 7/30* (2006.01)

(52) U.S. Cl.
CPC ...... *G06F 12/1009* (2013.01); *G06F 12/1027* (2013.01); *H03M 7/3088* (2013.01); *G06F 2212/1044* (2013.01); *G06F 2212/68* (2013.01)

(58) Field of Classification Search
CPC ............. G06F 12/1027; G06F 12/1009; G06F 2212/1044; G06F 2212/68; H03M 7/3088
USPC ......................................................... 711/105
See application file for complete search history.

(56) References Cited

U.S. PATENT DOCUMENTS

| 2014/0006745 A1* | 1/2014 | Fontenot ................ G06F 12/04 |
| | | 711/170 |
| 2018/0138921 A1* | 5/2018 | Arelakis ................. G06F 3/064 |
| 2019/0243780 A1 | 8/2019 | Gopal et al. |
| 2021/0056036 A1* | 2/2021 | Breslow .............. G06F 12/0864 |

FOREIGN PATENT DOCUMENTS

| CN | 106649149 A | 5/2017 |
| WO | 2015142341 A1 | 9/2015 |

OTHER PUBLICATIONS

"International Search Report and Written Opinion Issued in PCT Application No. PCT/US2021/017302", dated May 6, 2021, 15 Pages.

* cited by examiner

*Primary Examiner* — Hua J Song (57) ABSTRACT

A memory management system includes a physical memory associated with a computing device and a memory manager. The memory manager is configured to manage a shared memory cache as part of a compression of the physical memory using a cache compression algorithm, wherein a compression block size for the compression is a single cache line size. The physical memory includes a sector translation table (STT) region and a sector memory region. The memory manager uses a memory descriptor defined by an STT entry having a cache line map and a plurality of sector pointers to load cache from the physical memory to a level 3 Cache. The cache line map contains cache line metadata including a size of each cache line, a location of the cache line in one of the sectors pointed to by the STT entry, and a plurality of flags.

20 Claims, 9 Drawing Sheets

PHYSICAL MEMORY COMPRESSION

CROSS-REFERENCE TO RELATED APPLICATION

This nonprovisional application claims the benefit of and priority to U.S. Provisional Application No. 63/004,976, entitled "Physical Memory Compression", filed Apr. 3, 2020, which is incorporated by reference herein in its entirety.

BACKGROUND

Computer processor technology is rapidly advancing, resulting in continually increasing processor performance, which relies in part on the available memory within the system (e.g. memory available to central processing units (CPUs) in a server). The performance of such processors can be adversely affected by other bottlenecks in the computer. For example, the speed of data transfer from hard disk drives into random access memory (RAM) is a bottleneck in computer performance One way to reduce the impact of bottlenecks in the computer (e.g., server) is to store more data in RAM. However, the cost of RAM remains high enough that it is typically cost prohibitive to use very large amounts of RAM in computers, such as would be needed in server applications.

For example, presently up to about half the capital expenditure (CAPEX) cost for a server is dynamic RAM (DRAM). As such, a significant increase in the amount of DRAM in the server would result in a significant increase in the CAPEX cost of the server. As a result, presently available techniques for scaling for DRAM, particularly in server applications, add significant cost to the overall system. That is, as memory requirements increase, the need for physical memory (such as DRAM) increases, and with conventional techniques, the only practical approach to maintain system performance is to add more memory. Memory compression techniques are also known, but these techniques typically adversely affect system performance.

Thus, present memory management techniques include (i) compression techniques that involve compression on the storage device (e.g., storage disk), which adversely affects system performance, including system speed, or (ii) increasing the amount of physical memory, such as DRAM, which increases overall system cost. As a result, present techniques are not effectively scalable without a loss in system performance or increase in system cost.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A computerized method for tracking compressed memory comprises accessing a sector translation table (STT) defined by a descriptor, wherein the descriptor includes a cache line map and a plurality of sector pointers pointing to sector memory. The computerized method further comprises obtaining from the cache line map, cache line metadata relating to a cache line, wherein the cache line metadata includes one or more flags, a sector number, a cache segment length, and a length of the cache line. The computerized method also includes loading the cache line from physical memory into a last level cache (LLC) based on the cache line metadata, wherein a size of a compression block is the same as a size of a single cache line. The computerized method additionally includes tracking compressed physical memory using a plurality of cache lines.

Many of the attendant features will be more readily appreciated as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein.

Corresponding reference characters indicate corresponding parts throughout the drawings. In the figures, the systems are illustrated as schematic drawings. The drawings may not be to scale.

DETAILED DESCRIPTION

The computing devices and methods described herein are configured to perform inline physical memory compression using a combination of physical memory compression techniques and cache memory compression techniques in some examples. Inline physical memory compression implements real time and transparent memory compression inside a memory controller. As a result, reduced physical memory can be used, such as in a server, with the same amount processing being performed (e.g., a reduction of physical memory by a factor of two on average to perform the same level of processing).

In various examples, a memory management architecture and/or system performs memory compression at the cache line size. That is, memory management techniques disclosed herein provide inline memory compression at the cache line boundary. In one particular example, a cache compression algorithm is used to compress DRAM, such that cache compression techniques are extended to physical memory with memory management. A cache line map is implemented in some examples to track the memory compression at the cache line size. That is, the present disclosure uses a compression block size that is a single cache line size and not multiple cache lines. As a result, there is no discrepancy between the CPU cache line size and compression block size, such that the addition of compression cache is not needed, which would increase the performance overhead and bandwidth overhead. Thus, the compression algorithm of the present disclosure is "lightweight" and power efficient (e.g., not "heavy duty" or expensive in terms of surface area, power, and latency). In this manner, when a processor is programmed to perform the operations described herein, the processor is used in an unconventional way, and allows for increased memory performance without the addition of physical memory or decreased processor performance, which thereby improves the user experience.

In some examples, the memory management techniques perform compression higher in the overall compression hierarchy. That is, cache lines are stored compressed in Last Level Cache (LLC), resulting in an increased LLC and increased performance With the present disclosure, and the cache compression algorithm described herein, compression of physical memory is performed using memory management techniques that contribute a very small (e.g., 3%) overhead to manage compressed physical memory.

More particularly, various examples perform physical memory compression that includes compression of user data, as well as compression of memory blocks not otherwise used. For example, most applications tend to have zero blocks in memory, which can account for as much as twenty-one percent of the total physical memory blocks in server workloads. These blocks are rarely accessed by the CPU and tend to be very "cold". The inline physical memory compression disclosed herein compresses these blocks efficiently, thereby freeing most of these memory blocks (e.g., pages) to be used elsewhere.

In one example, total physical memory compression is implemented, which decreases system cost (reduces the demand for physical memory) and improves overall system performance (reduces I/O and paging operations). Two configurations are disclosed herein to implement physical memory compression: CPU based and external memory management controller (MMC)/Bridge based. However, as should be appreciated, the present disclosure is not limited to these configurations, which are described for illustrative purposes only. Various systems implemented as different architectures will now be described.

Figure 1:
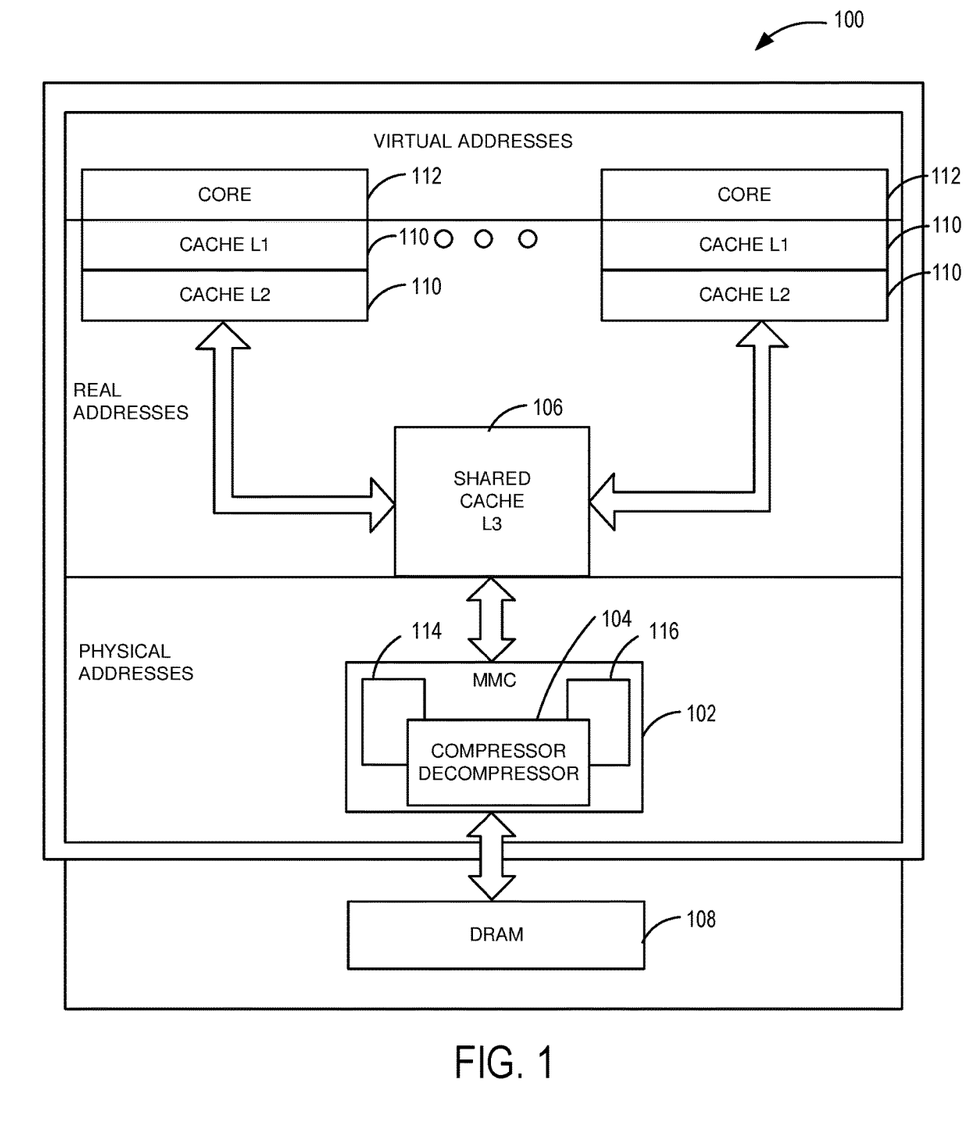
FIG. 1 is a block diagram illustrating a memory management architecture in accordance with one example.

FIG. 1 is a block diagram illustrating a memory management architecture 100 in accordance with one example. In this implementation, the memory management architecture 100 is illustrated as a CPU based memory compression configuration. That is, the memory management architecture 100 is a CPU based cache management configuration, wherein the compression is integrated in the CPU memory hierarchy and compression/decompression is seamlessly performed as part of the load/store operation semantics. There are two different arrangements for the CPU based memory compression configuration. In a first arrangement as illustrated in FIG. 1, the compression/decompression occurs at the physical memory level. That is, compressors and decompressors 104 are positioned (connected) between an LLC 106, illustrated as a level 3 shared cache (Shared Cache L3) and physical memory 108, illustrated as DRAM. The compressors and decompressors 104 are used (invoked) as a result of LLC cache write backs or LLC read misses. As should be appreciated, in this configuration, the LLC 106 contains decompressed data, while the physical memory 108 is compressed. Additionally, the compressors and decompressors 104 can be any type of compression and decompression devices that perform data compression and decompression using one or more different signal processing techniques.

Figure 2:
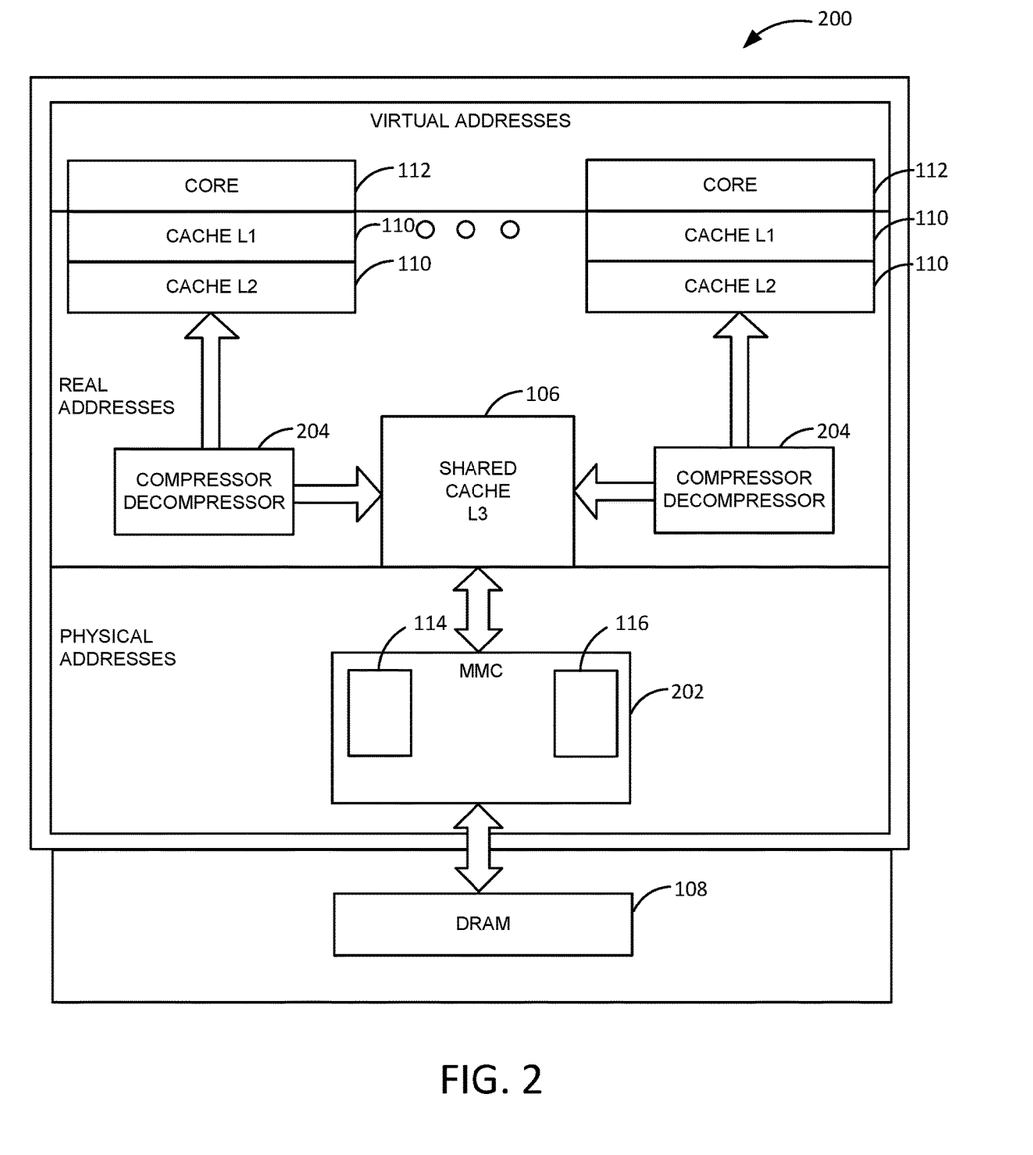
FIG. 2 is a block diagram illustrating a memory management architecture in accordance with another example.

In a second arrangement as illustrated in FIG. 2, the memory management architecture 200 is configured with compression/decompression, namely compressors and decompressors 204 that "sit on top" of the LLC 106 between the LLC 106 and the other caches 110. That is, the compression and decompression operations happen after an LLC read or LLC write by the compressors and decompressors 204 connected between the LLC 106 and the other caches 110. In this arrangement, both the LLC 106 and the physical memory 108 are compressed. Thus, in the memory management architecture of FIG. 2, MMC based memory compression is provided with compressed L3 cache. It should be noted that like numerals represent like parts in the various examples.

As can be seen in FIGS. 1 and 2, in both arrangements, the MMC 102 and physical memory 108 operate at the physical addresses level and the LLC 106 operates at the real address level and communicates with other caches 110, illustrated as level 1 and level 2 caches (Cache L1 and Cache L2). Additionally, a core 112 (e.g., a CPU processing core) operates at the virtual address level.

In operation, the MMC 102 controls memory management to provide physical memory compression as described in more detail herein. This control includes using a sector translation lookaside buffer (STLB) 114 and a free sector cache (FSC) 116 to manage the memory compression.

Figure 3:
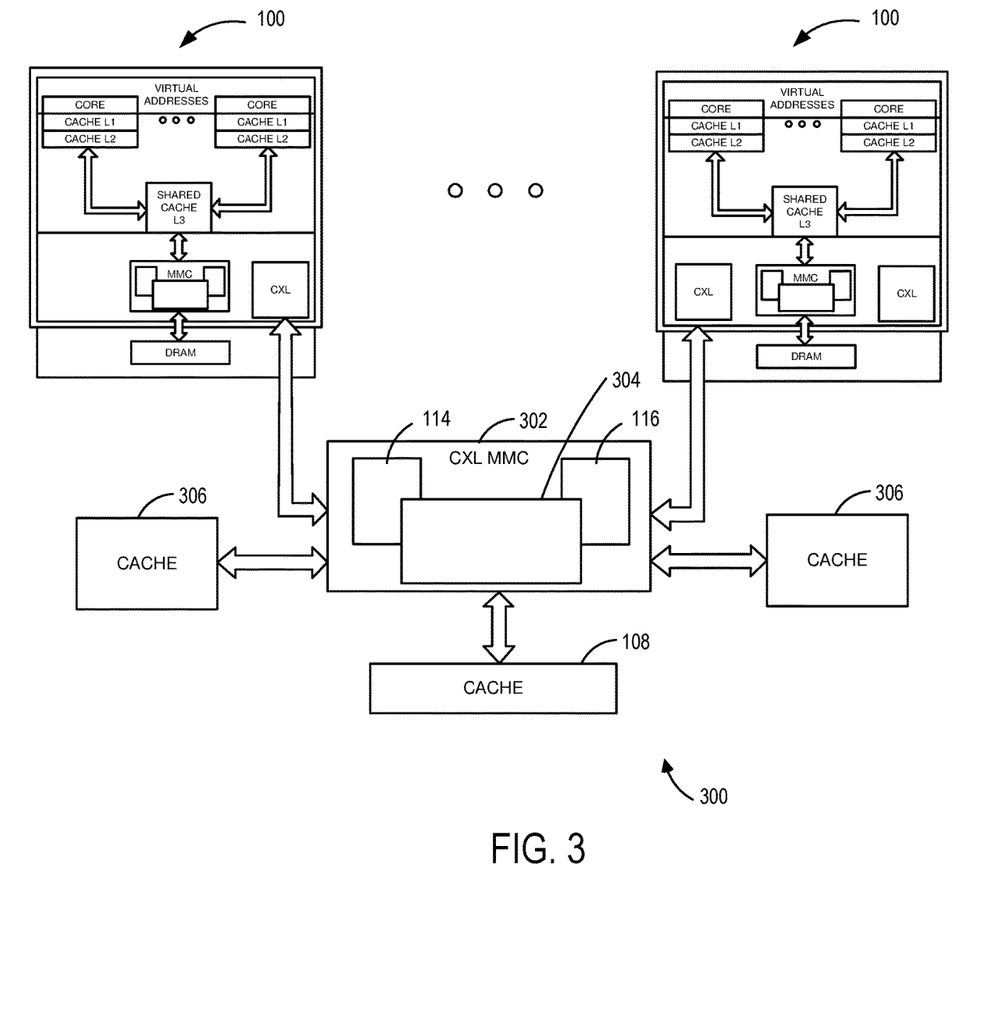
FIG. 3 is a block diagram illustrating a memory management architecture in accordance with another example.

FIG. 3 is a block diagram illustrating a memory management architecture 300 in accordance with another example. In this implementation, the memory management architecture 300 is illustrated as a bridge based memory compression configuration, namely an external MMC/Bridge based configuration. In this configuration, compressors/decompressors 304 "sit outside" the CPU (and the integrated MMC 102 or 202) in an external memory interface, illustrated as a compute express link (CXL) CPU-to-device interconnect configured as a CXL MMC 302 that is also coupled to external cache 306. The compressors/decompressors 304 are external devices that thereby form part of an external memory controller or bridge. It should be appreciated that this configuration operates well in systems with extended memory systems through CXL, GenZ, OpenCAPI or other similar mechanisms. In various examples, the compression with the memory management architecture 300 facilitates reducing memory requirements, as well as reducing bandwidth requirements on the memory interconnect.

With the architectures described herein, the present disclosure implements one or more compression algorithms In some examples, a cache compression algorithm is used to compress physical memory. Various compression algorithms and implementation considerations will now be discussed. In particular, in some examples, the compression algorithm is lossless, such that no information is lost in the process of compression. In other words, decompressing an already compressed block always generates the original uncompressed block 100% of the time. Second, the compression algorithm of various examples has low latency for compression and decompression. Stated differently, decompression and compression does not increase memory load store latencies. Third, the compression algorithm provides a good compression efficiency for a cache line size (thirty-two or sixty-four bytes in various examples) memory block. It should be appreciated that compression algorithm complexity does not necessarily lead to a better compression ratio. Fourth, the compression algorithm has a low power consumption requirement, such that the overall thermal design power (TDP) of the CPU in not increased. Fifth, the compression algorithm has a low die area requirement.

The present disclosure recognizes the observation behind base-delta-immediate (BDI) compression that, for many cache lines, the data values stored within the line have a low dynamic range (i.e., the relative difference between values is small). In such cases, the cache line can be represented in a compact form using a common base value plus an array of relative differences ("deltas"), having a combined size that is much smaller than the original cache line.

Firewalls Policies Compression (FPC), a lossless, single pass, linear-time compression algorithm targets streams of double-precision floating-point data with unknown internal structure, such as the data seen by the network or a storage device in scientific and high-performance computing systems. FPC delivers a good average compression ratio on hard-to-compress numeric data.

C-Pack+Z achieves compression by two means: (1) using statically decided, compact encodings for frequently appearing data words and (2) encoding using a dynamically updated dictionary allowing adaptation to other frequently appearing words. The dictionary supports partial word matching as well as full word matching. Unlike BDI and FPC, the use of the dictionary, albeit small, can increase the compression ratio without adding extra complexity.

Figure 4:
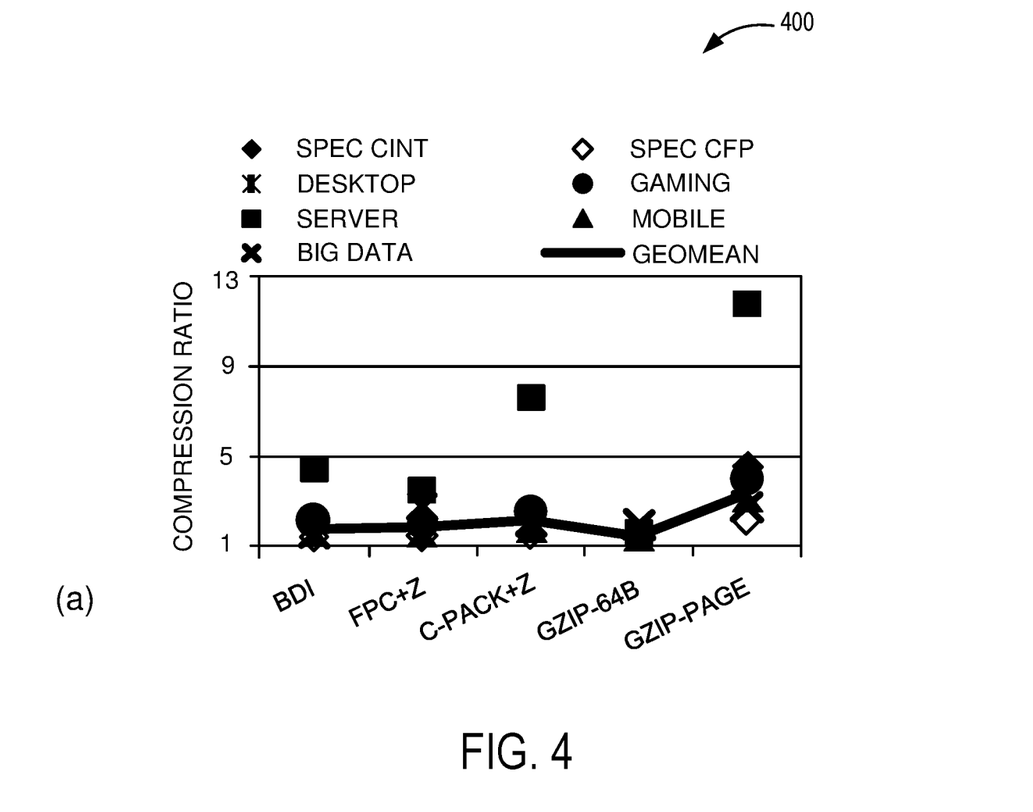
FIG. 4 is a graph illustrating compression ratios of different compression algorithms.

It was determined that C-Pack+Z has the highest compression ratio for block sizes of sixty-four bytes as illustrated in the graph 400 of FIG. 4. GZIP is added as a comparison to the "gold standard" for offline data compression. However, GZIP requires large block sizes to attain optimum efficiency. For block size of sixty-four bytes, C-Pack+Z has superior performance and used in various examples.

An example of memory management of compressed memory will now be discussed. It should be appreciated that the memory management can be implemented with any of the architectures described herein, or other architectures.

Figure 5:
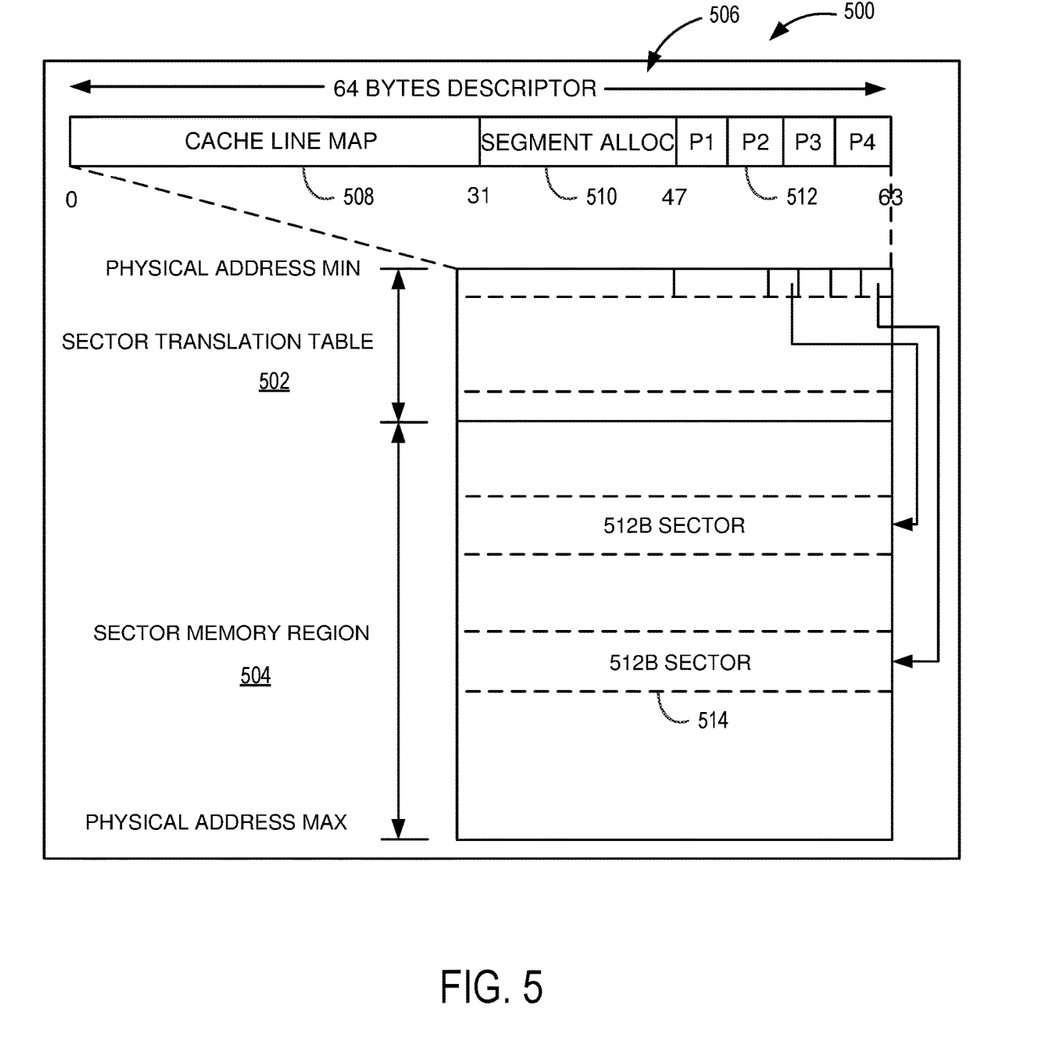
FIG. 5 is a block diagram illustrating physical memory management.

More particularly, and with reference also to FIGS. 1-3, during operation, with a physical memory management 500 as illustrated in FIG. 5, one or more processing cores execute instructions using virtual addresses. All virtual addresses are then converted to real addresses using a CPU TLB table (e.g., a STLB 114 table). The real addresses are used to access cache lines in the L1, L2, and L3 caches 110, 110, and 106, respectively. In the case of an L3 cache miss, the real address is converted to a physical address before the MMC 102, 202 or 302 issues a load or store operation to the DIMM. The MMC 102, 202 or 302 performs this conversion using the STLB 114 inside the MMC 102, 202 or 302. In one example, the STLB 114 is a cache of entries from a sector translation table (STT) 502 as illustrated in FIG. 5. The present disclosure implements physical memory organization as described below.

Physical memory is portioned into two main regions: a STT 502 region and a sector memory region 504. The STT 502 is an array of a 64-byte descriptor 506. Each descriptor 506 contains metadata and location information corresponding to thirty two real memory cache lines, which is equivalent to 2 KB of real memory. In the illustrated example, the 64-byte descriptor 506 includes a thirty-two byte cache line map 508, a sixteen byte segment allocator 510 and four sector pointers 512 totaling sixteen bytes (i.e., four sector pointers 512 each of four bytes). In this configuration, the STT 502 is metadata that is used by the MMC 102, 202 or 302 to manage and track actual compressed physical memory.

The second section is the sector memory region 504. This sector memory region 504 is divided into 512-byte blocks 514 and is the actual memory (physical or real memory) that holds/stores operating system and application data and content. In one example, each STT entry can point to up to four of the blocks 514 for a maximum of 2 KB. If 2 KB of real memory is all zero, then the corresponding STT entry points to zero blocks. In the case where the 2 KB compression ratio is 1 (uncompressible), the STT entry points to four of the blocks 514.

Figure 6:
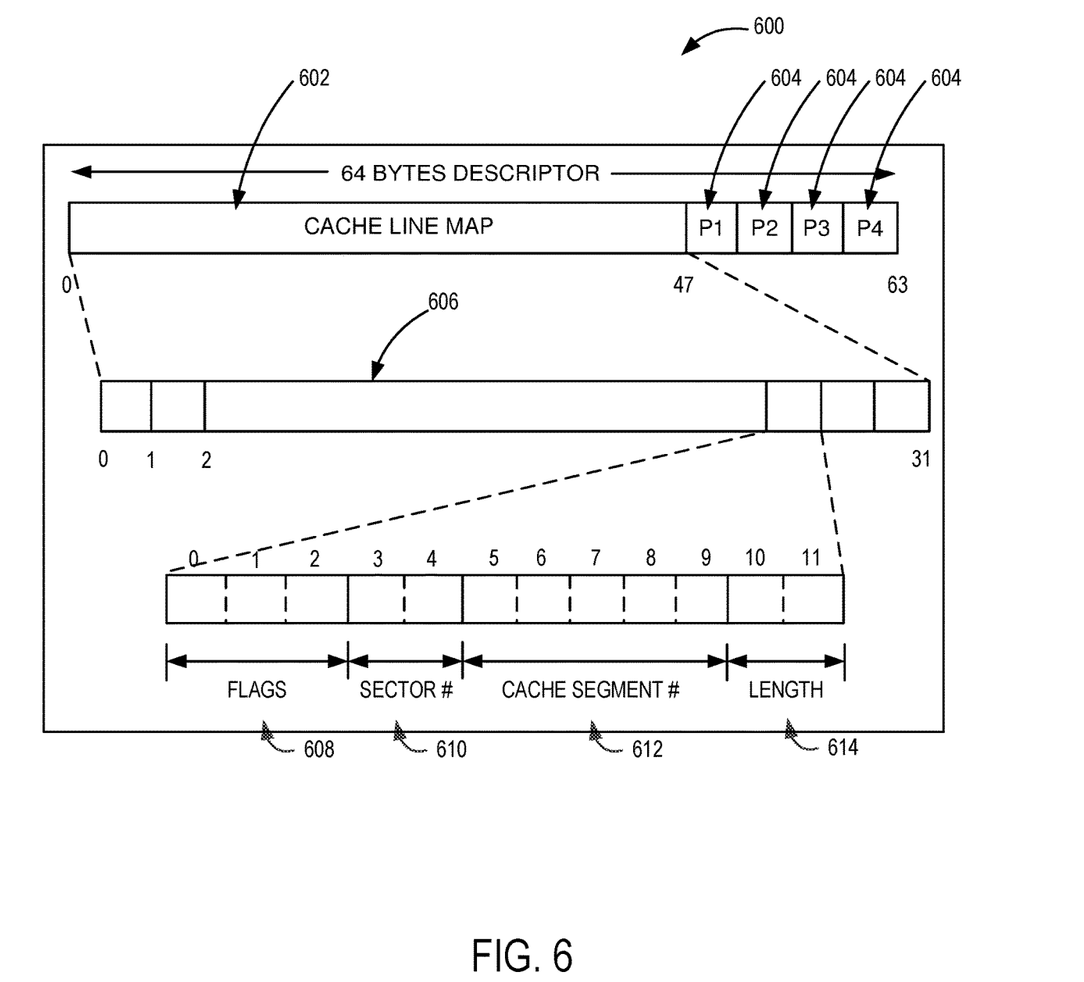
FIG. 6 is a block diagram illustrating a memory descriptor in accordance with one example.

In various examples, a memory descriptor 600, illustrated as an STT entry is implemented as shown in FIG. 6. Each entry is divided into two main regions: a cache line map 602 and four sector pointers 604. The four sector pointers 604 are four 4 byte fields. Each field is a pointer to a 512-byte memory sector that acts as storage of the compressed content of the cache lines. Depending on the compressibility ratio of the cache lines, zero to four sector pointers 604 can be used. In the case where all thirty-two cache lines associated with the STT entry are zero, all pointers 604 are null because the present disclosure uses an optimization technique to store the zero cache lines. On the other hand, if all the cache lines are not compressible or have very low compression ratio, all four pointers 604 point to physical memory sectors.

In one example, the first 48-byte area of the STT entry is the cache line map 602 that contains cache line metadata, such as the size of each cache line, the location of the cache line in one of the sectors pointed to by the STT entry, as well as other flags. In the example illustrated in FIG. 6, the 48-byte map is divided into thirty-two twelve-bit fields 606. The first three bits 608 are flags relating to the cache line. Bit 0 describes whether the cache line is allocated 1 or unallocated 0. Bit 2 is 0 if the cache line is zero, otherwise the bit is 1. Bit 3 is 0 if the cache line is uncompressed and 1 if the bit is compressed. The next two bits 610 (Bits 3-4) specify the sector (from the possible four sectors) where cache line is stored. Each memory sector is logically divided into sixteen-byte segments. A compressed cache line uses zero to four segments for storage for that cache line. The next bits 612 (Bits 5-9) are used to store the address (sixteen-byte aligned) of the compressed line within the sector. The final bits 614 (Bits 10-11) are used to store the length of the cache line in sixteen-byte units. It should be noted that the trio (or triplet) of sector number (sector #), segment offset (cache segment #), and length uniquely identify the compressed cache line.

In operation, and with reference also to FIGS. 1-3, the MMC 102, 202, 302 is configured as a memory manager that receives a real address and zeros the least significant eleven bits to obtain the STT entry that contains all of the metadata that corresponds to the thirty-two cache lines associated with that entry. The MMC 102, 202, 302 loads the entry into the STLB 114. In one example, bits 6-11 in the real address include the cache line number that is to be loaded. The MMC 102, 202, 302 locates the metadata flags, sector #, cache segment #, and length. The metadata has all the information for the MMC 102, 202, 302 to load the cache line from the physical memory into the L3 cache 106. In one example, each physical memory access uses two memory reads. One read for reading the STT entry and a second read for the actual cache line. In some examples, to optimize physical memory access, an STLB cache is added to the MMC 102, 202, 302 to help reduce STT entry reads.

Figure 7:
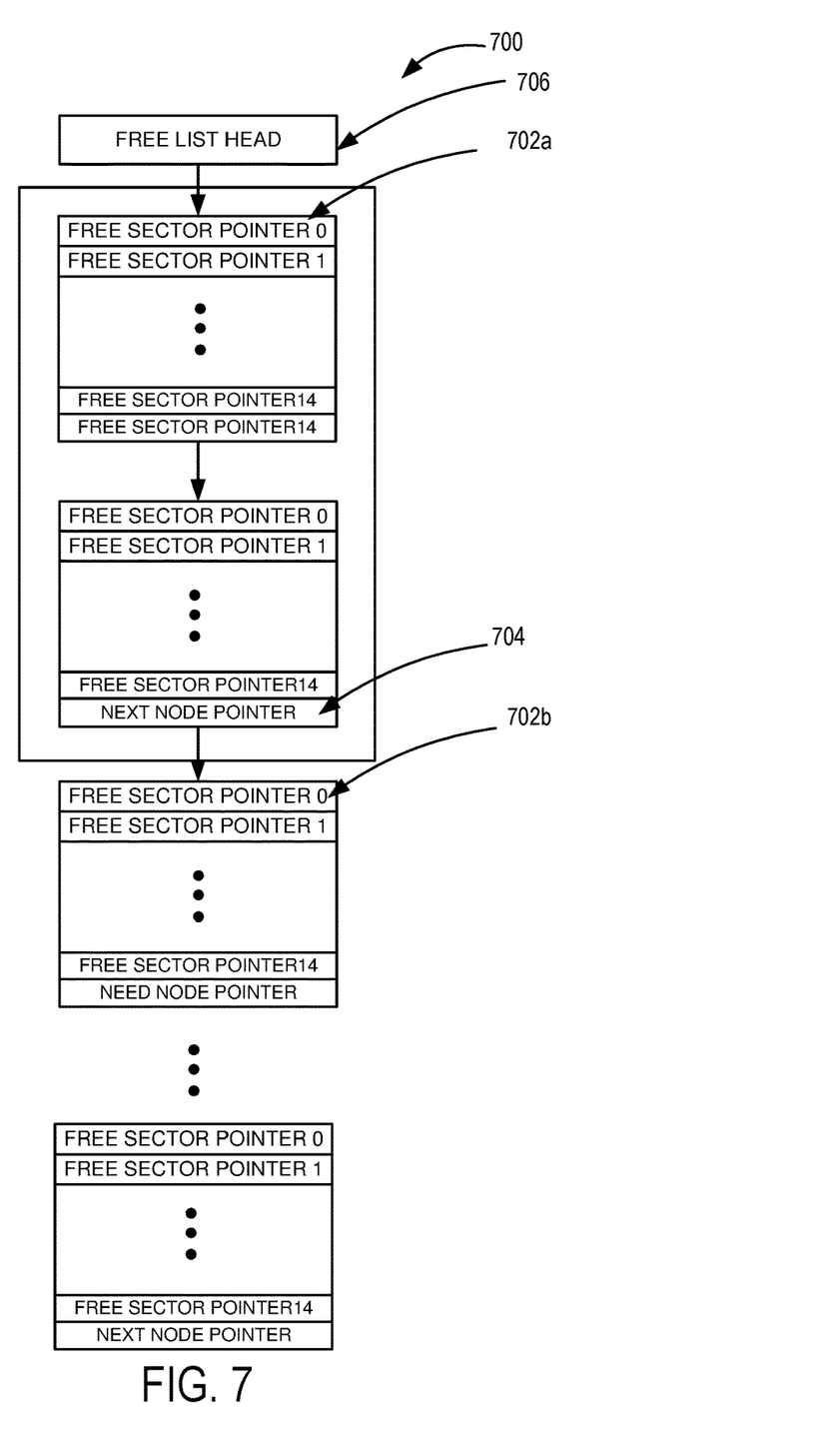
FIG. 7 is a block diagram of a free sector heap in accordance with one example.

In one example, all free memory sectors are organized into a heap 700 (i.e., a free sector heap) as shown in FIG. 7 and that uses free sectors for storage. The heap 700 is accessed by a free list head 706. In the example, each sector can store up to sixty-three pointers 702a to free sectors. The last eight bytes of the sector is a pointer 704 to the next sector containing the free sector pointers 702b. The MMC 102, 202, 302 in some examples includes a free sector register (illustrated as the free list head) that points to the first sector of the heap 700. To optimize free sector allocation, in one example, the MMC 102, 202, 302 caches a few sectors (e.g., three or four sectors) of free memory sectors in the FSC 116. As free memory sectors are consumed, the sectors used by the free sector heap are freed up and are also added to the heap 700. Hence, the heap 700 does not consume any physical memory.

Other mechanisms are also used by the present disclosure. In some examples, the MMC 102, 202, 302 includes a set of registers that keep track of the data compression ratio, ratio of free to used physical memory sectors, etc. In addition, the MMC 102, 202, 302 includes a set of programmable interrupts to be used to generate events when certain counters are reached in some examples.

Figure 8:
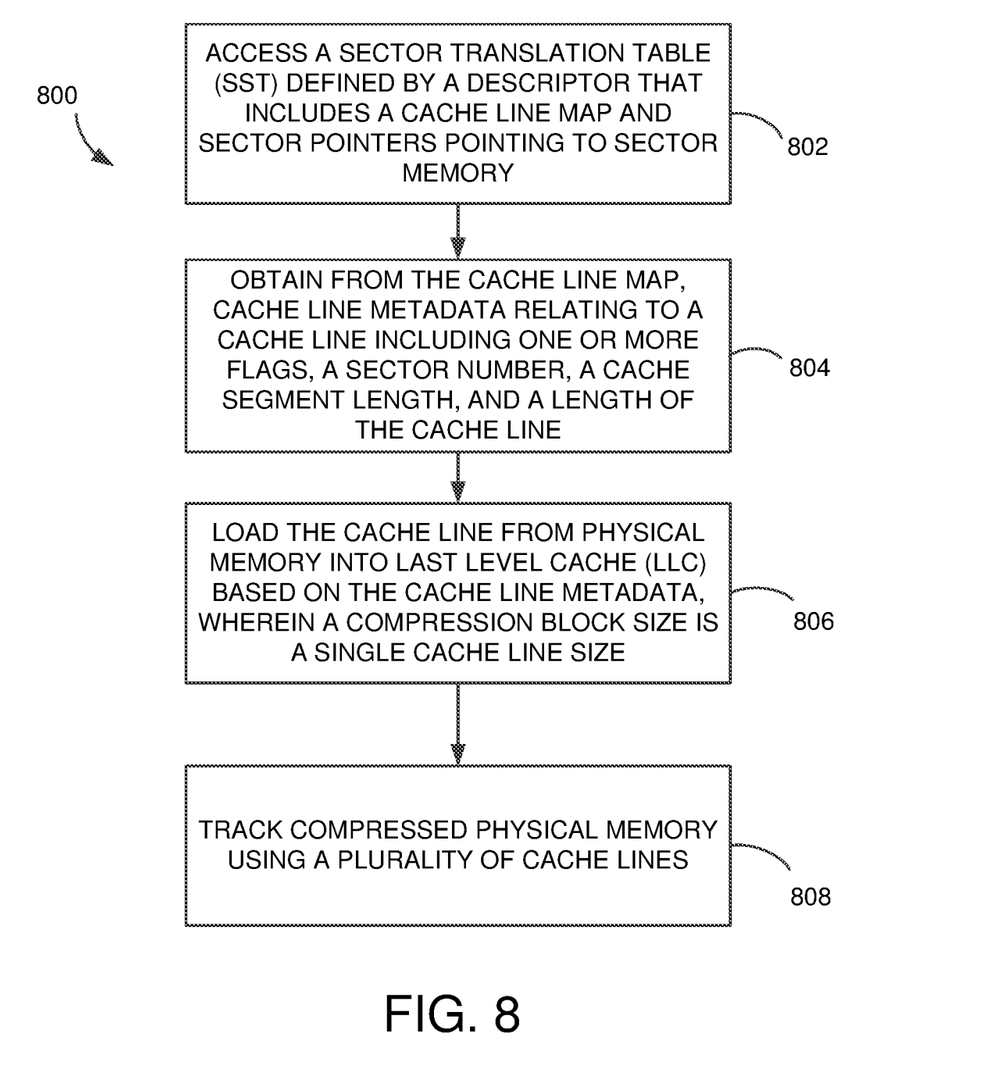
FIG. 8 illustrates a flowchart of a method for tracking compressed physical memory according to an example.

A method 800 to track compressed physical memory to allow compression of the physical memory using a cache compression algorithm is shown in FIG. 8. For example, by implementing the method 800, a cache compression algorithm can be used to compress DRAM at the cache line size. In some examples, physical memory compression and cache compression are used to compress inline physical memory. The operations illustrated in the flowchart described herein can be performed in a different order than is shown, can include additional or fewer steps and can be modified as desired or needed. Additionally, one or more operations can be performed simultaneously, concurrently, or sequentially.

More particularly, and with reference also to FIGS. 1-7 and 9, the method 800 includes accessing an STT defined by a descriptor at 802. The descriptor in some examples includes a cache line map and sector pointers pointing to sector memory. For example, as described herein, the memory descriptor 600 includes the cache line map 602 and sector pointers 604. As should be appreciated, the memory descriptor 600 can have different configurations that allow for compression at the cache line size.

The method 800 obtains from the cache line map, cache line metadata at 804. The cache line metadata includes one or more flags, a sector number, a cache segment length, and the length of cache line. One example of a configuration of the metadata is illustrated in FIG. 6. It should be appreciated that the order and size of each of the portions of the metadata can be varied as desired or needed. Each descriptor, in some examples, contains metadata and location information about thirty-two real memory cache lines, which is equivalent to 2 KB of real memory.

The method 800 loads, at 806, a cache line from physical memory into LLC based on the cache line metadata, wherein a compression block size is a single cache line. That is, the loading of the cache line allows for memory management at the cache line boundary to perform cache compression techniques to compress physical memory without using a compressed memory cache. With the metadata of the present disclosure, compressed physical memory is tracked to allow for use of cache compression techniques. For example, at 808, physical memory is tracked using a plurality of cache lines. That is, the method allows for memory management of physical memory. In one example, the STT defined by the metadata is used by the MMC, 102, 202, Or 302 to manage and track actual compressed physical memory.

It should be appreciated that the present disclosure and the examples described herein can be implemented in different environments. For example, the memory management and compression techniques described herein can be implemented in cloud computing environments. However, the present disclosure can be implemented in connection with any type of computing device or system, such as the computing device 900 illustrated in FIG. 9.

Example Operating Environment

Figure 9:
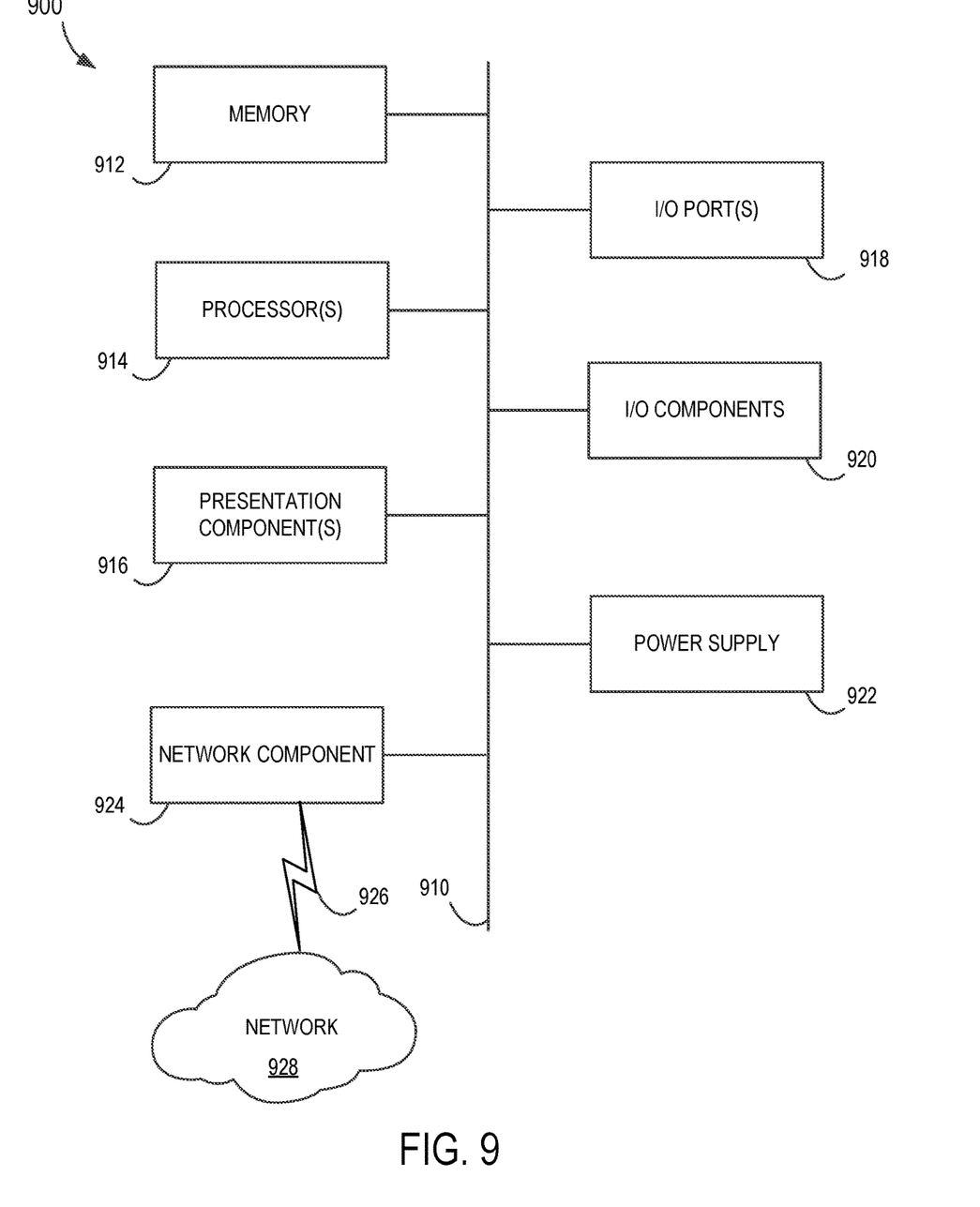
FIG. 9 is a block diagram of an example computing environment suitable for implementing some of the various examples disclosed herein.

FIG. 9 is a block diagram of an example computing device 900 for implementing aspects disclosed herein, and is designated generally as computing device 900. The computing device 900 is but one example of a suitable computing environment and is not intended to suggest any limitation as to the scope of use or functionality of the examples disclosed herein. Neither should the computing device 900 be interpreted as having any dependency or requirement relating to any one or combination of components/modules illustrated. The examples disclosed herein may be described in the general context of computer code or machine-useable instructions, including computer-executable instructions such as program components, being executed by a computer or other machine, such as a personal data assistant or other handheld device. Generally, program components including routines, programs, objects, components, data structures, and the like, refer to code that performs particular tasks, or implement particular abstract data types. The discloses examples may be practiced in a variety of system configurations, including servers, personal computers, laptops, smart phones, mobile tablets, hand-held devices, consumer electronics, specialty computing devices, etc. The disclosed examples may also be practiced in distributed computing environments when tasks are performed by remote-processing devices that are linked through a communications network.

The computing device 900 includes a bus 910 that directly or indirectly couples the following devices: a computer-storage memory 912 (which includes physical memory, such as DRAM), one or more processors 914, one or more presentation components 916, input/output (I/O) ports 918, I/O components 920, a power supply 922, and a network component 924. While the computer device 900 is depicted as a seemingly single device, multiple computing devices 900 may work together and share the depicted device resources. For instance, the computer-storage memory 912 may be distributed across multiple devices, processor(s) 914 may provide housed on different devices, and so on.

The bus 910 represents what may be one or more busses (such as an address bus, data bus, or a combination thereof). Although the various blocks of FIG. 9 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. Such is the nature of the art, and reiterate that the diagram of FIG. 9 is merely illustrative of an exemplary computing device that can be used in connection with one or more disclosed examples. Distinction is not made between such categories as "workstation," "server," "laptop," "hand-held device," etc., as all are contemplated within the scope of FIG. 9 and the references herein to a "computing device." The computer-storage memory 912 may take the form of the computer-storage media references below and operatively provide storage of computer-readable instructions, data structures, program modules and other data for the computing device 900. For example, the computer-storage memory 912 may store an operating system, a universal application platform, or other program modules and program data. The computer-storage memory 912 may be used to store and access instructions configured to carry out the various operations disclosed herein.

As mentioned below, the computer-storage memory 912 may include computer-storage media in the form of volatile and/or nonvolatile memory, removable or non-removable memory, data disks in virtual environments, or a combination thereof. And the computer-storage memory 912 may include any quantity of memory associated with or accessible by the computing device 900. The memory 912 may be internal to the computing device 900 (as shown in FIG. 9), external to the computing device 900 (not shown), or both (not shown). Examples of the memory 912 include, without limitation, random access memory (RAM); read only memory (ROM); electronically erasable programmable read only memory (EEPROM); flash memory or other memory technologies; CD-ROM, digital versatile disks (DVDs) or other optical or holographic media; magnetic cassettes, magnetic tape, magnetic disk storage or other magnetic storage devices; memory wired into an analog computing device; or any other medium for encoding desired information and for access by the computing device 900. Additionally, or alternatively, the computer-storage memory 912 may be distributed across multiple computing devices 900, e.g., in a virtualized environment in which instruction processing is carried out on multiple devices 900. For the purposes of this disclosure, "computer storage media," "computer-storage memory," "memory," and "memory devices" are synonymous terms for the computer-storage memory 912, and none of these terms include carrier waves or propagating signaling.

The processor(s) 914 may include any quantity of processing units that read data from various entities, such as the memory 912 or I/O components 920. Specifically, the processor(s) 914 are programmed to execute computer-executable instructions for implementing aspects of the disclosure. The instructions may be performed by the processor, by multiple processors within the computing device 900, or by a processor external to the client computing device 900. In some examples, the processor(s) 914 are programmed to execute instructions. Moreover, in some examples, the processor(s) 914 represent an implementation of analog techniques to perform the operations described herein. For example, the operations may be performed by an analog client computing device 900 and/or a digital client computing device 900. Presentation component(s) 916 present data indications to a user or other device. Exemplary presentation components include a display device, speaker, printing component, vibrating component, etc. One skilled in the art will understand and appreciate that computer data may be presented in a number of ways, such as visually in a graphical user interface (GUI), audibly through speakers, wirelessly between computing devices 900, across a wired connection, or in other ways. Ports 918 allow computing device 900 to be logically coupled to other devices including I/O components 920, some of which may be built in. Examples I/O components 920 include, for example but without limitation, a microphone, joystick, game pad, satellite dish, scanner, printer, wireless device, etc.

The computing device 900 may operate in a networked environment via the network component 924 using logical connections to one or more remote computers. In some examples, the network component 924 includes a network interface card and/or computer-executable instructions (e.g., a driver) for operating the network interface card. Communication between the computing device 900 and other devices may occur using any protocol or mechanism over any wired or wireless connection. In some examples, the network component 924 is operable to communicate data over public, private, or hybrid (public and private) using a transfer protocol, between devices wirelessly using short range communication technologies (e.g., near-field communication (NFC), Bluetooth™ branded communications, or the like), or a combination thereof. For example, network component 924 communicates over a communication link 926 with a network 928.

Although described in connection with an example computing device 900, examples of the disclosure are capable of implementation with numerous other general-purpose or special-purpose computing system environments, configurations, or devices. Examples of well-known computing systems, environments, and/or configurations that may be suitable for use with aspects of the disclosure include, but are not limited to, smart phones, mobile tablets, mobile computing devices, personal computers, server computers, hand-held or laptop devices, multiprocessor systems, gaming consoles, microprocessor-based systems, set top boxes, programmable consumer electronics, mobile telephones, mobile computing and/or communication devices in wearable or accessory form factors (e.g., watches, glasses, headsets, or earphones), network PCs, minicomputers, mainframe computers, distributed computing environments that include any of the above systems or devices, VR devices, holographic device, and the like. Such systems or devices may accept input from the user in any way, including from input devices such as a keyboard or pointing device, via gesture input, proximity input (such as by hovering), and/or via voice input.

Examples of the disclosure may be described in the general context of computer-executable instructions, such as program modules, executed by one or more computers or other devices in software, firmware, hardware, or a combination thereof. The computer-executable instructions may be organized into one or more computer-executable components or modules. Generally, program modules include, but are not limited to, routines, programs, objects, components, and data structures that perform particular tasks or implement particular abstract data types. Aspects of the disclosure may be implemented with any number and organization of such components or modules. For example, aspects of the disclosure are not limited to the specific computer-executable instructions or the specific components or modules illustrated in the figures and described herein. Other examples of the disclosure may include different computer-executable instructions or components having more or less functionality than illustrated and described herein. In examples involving a general-purpose computer, aspects of the disclosure transform the general-purpose computer into a special-purpose computing device when configured to execute the instructions described herein.

By way of example and not limitation, computer readable media comprise computer storage media and communication media. Computer storage media include volatile and nonvolatile, removable, and non-removable memory implemented in any method or technology for storage of information such as computer readable instructions, data structures, program modules, or the like. Computer storage media are tangible and mutually exclusive to communication media. Computer storage media are implemented in hardware and exclude carrier waves and propagated signals. Computer storage media for purposes of this disclosure are not signals per se. Exemplary computer storage media include hard disks, flash drives, solid-state memory, phase change random-access memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. In contrast, communication media typically embody computer readable instructions, data structures, program modules, or the like in a modulated data signal such as a carrier wave or other transport mechanism and include any information delivery m In examples involving a general-purpose computer, aspects of the disclosure transform the general-purpose computer into a special-purpose computing device when configured to execute the instructions described herein.

A memory management system comprises a physical memory associated with a computing device; and a memory manager configured to manage a shared memory cache as part of a compression of the physical memory using a cache compression algorithm, wherein a compression block size for the compression is a single cache line size.

A computerized method for tracking compressed memory, the computerized method comprises accessing a sector translation table (STT) defined by a descriptor, the descriptor including a cache line map and a plurality of sector pointers pointing to sector memory; obtaining from the cache line map, cache line metadata relating to a cache line, the cache line metadata including one or more flags, a sector number, a cache segment length, and a length of the cache line; loading the cache line from physical memory into a last level cache (LLC) based on the cache line metadata, wherein a size of a compression block is the same as a size of a single cache line; and tracking compressed physical memory using a plurality of cache lines.

One or more computer storage media have computer-executable instructions to perform memory management that, upon execution by a processor, cause the processor to at least: access a sector translation table (STT) defined by a descriptor, the descriptor including a cache line map and a plurality of sector pointers pointing to sector memory; obtain from the cache line map, cache line metadata relating to a cache line, the cache line metadata including one or more flags, a sector number, a cache segment length, and a length of the cache line; load the cache line from physical memory into a last level cache (LLC) based on the cache line metadata, wherein a size of a compression block is the same as a size of a single cache line; and track compressed physical memory using a plurality of cache lines.

Alternatively, or in addition to the other examples described herein, examples include any combination of the following:

wherein the physical memory comprises dynamic random access memory (DRAM) and the memory manager comprises a Sector Translation Lookaside Buffer (STLB) having a cache of entries from a sector translation table, wherein the memory manager is configured to use the STLB to convert real memory addresses to physical memory addresses of the physical memory;

wherein the physical memory comprises a sector translation table (STT) region and a sector memory region, the memory manager using a memory descriptor defined by an STT entry having a cache line map and a plurality of sector pointers;

wherein the plurality of sector pointers comprises four sector pointers, each sector pointer being a 4 byte field, wherein each 4 byte field is a pointer to a 512-byte memory sector that acts as storage of the compressed content of the cache line;

wherein a first 48-byte area of the STT entry is a cache line map that contains cache line metadata including a size of each cache line, a location of the cache line in one of the sectors pointed to by the STT entry, and a plurality of flags;

wherein the first 48-byte area is configured as a map divided into thirty-two twelve-bit fields, a first three bits being flags relating to the cache line;

further comprising a level 3 cache (L3 Cache), wherein the memory manager is configured to locate one or more metadata flags, and the cache line metadata, and use the one or more metadata flags and the cache line metadata to load the cache line from the physical memory into the L3 cache;

wherein a sector number, a segment offset, and a length uniquely identifies a compressed cache line;

further comprising a free sector cache configured to store free memory sectors;

wherein the physical memory has a block size of sixty-four bytes and the cache compression algorithm is a C-Pack+Z compression algorithm;

wherein the memory manager comprises a plurality of compressors and decompressors;

wherein the sector memory is configured into physical memory blocks storing at least one of operating system data and application data, and further comprising receiving a real address and zeroing a plurality of least significant bits of the real address to obtain an STT entry that contains the cache line map and a plurality of sector pointers;

further comprising organizing free memory sectors into a free sector heap, the free sector heap using the free memory sectors for storage, wherein the sector memory includes sectors storing pointers to the free memory sectors; and further comprising caching a plurality of sectors of the free memory sectors;

Any range or device value given herein can be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above can relate to one embodiment or can relate to several embodiments. The embodiments are not limited to those that solve any or all of the stated problems or those that have any or all of the stated benefits and advantages. It will further be understood that reference to 'an' item refers to one or more of those items.

The embodiments illustrated and described herein as well as embodiments not specifically described herein but within the scope of aspects of the claims constitute exemplary means for memory compression. The illustrated one or more processors 914 together with the computer program code stored in memory 912 constitute exemplary processing means for managing the compression of memory as described herein.

The term "comprising" is used in this specification to mean including the feature(s) or act(s) followed thereafter, without excluding the presence of one or more additional features or acts.

In some examples, the operations illustrated in the figures can be implemented as software instructions encoded on a computer readable medium, in hardware programmed or designed to perform the operations, or both. For example, aspects of the disclosure can be implemented as a system on a chip or other circuitry including a plurality of interconnected, electrically conductive elements.

The order of execution or performance of the operations in examples of the disclosure illustrated and described herein is not essential, unless otherwise specified. That is, the operations can be performed in any order, unless otherwise specified, and examples of the disclosure can include additional or fewer operations than those disclosed herein. For example, it is contemplated that executing or performing a particular operation before, contemporaneously with, or after another operation is within the scope of aspects of the disclosure.

When introducing elements of aspects of the disclosure or the examples thereof, the articles "a," "an," "the," and "said" are intended to mean that there are one or more of the elements. The terms "comprising," "including," and "having" are intended to be inclusive and mean that there can be additional elements other than the listed elements. The term "exemplary" is intended to mean "an example of." The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A memory management system comprising:
   a physical memory associated with a computing device; and
   a memory manager configured to manage a shared memory cache, the managing including a compression of the physical memory using a cache compression algorithm, wherein a compression block size for the compression is a single cache line size, the memory manager using a memory descriptor having a cache line map and a plurality of sector pointers, the cache line map containing cache line metadata including a size of each cache line, a location of the cache line in a sector, and a plurality of flags.

2. The memory management system of claim 1, wherein the physical memory comprises dynamic random access memory (DRAM) and the memory manager comprises a sector translation lookaside buffer (STLB) having a cache of entries from a sector translation table (STT), wherein the memory manager is configured to use the STLB to convert real memory addresses to physical memory addresses of the physical memory.

3. The memory management system of claim 1, wherein the physical memory comprises a sector translation table (STT) region and a sector memory region, wherein the memory descriptor is defined by an STT entry.

4. The memory management system of claim 3, wherein the cache line map is a first 48-byte area of the STT entry.

5. The memory management system of claim 4, wherein the first 48-byte area is configured as a map divided into thirty-two twelve-bit fields, a first three bits being flags relating to the cache line.

6. The memory management system of claim 1, wherein the plurality of sector pointers comprises four sector pointers, each sector pointer being a 4-byte field, wherein each 4-byte field is a pointer to a 512-byte memory sector that acts as storage of a compressed content of the cache line.

7. The memory management system of claim 1, further comprising a level 3 cache (L3 cache), wherein the memory manager is configured to locate one or more metadata flags, and the cache line metadata, and use the one or more metadata flags and the cache line metadata to load the cache line from the physical memory into the L3 cache.

8. The memory management system of claim 1, wherein a sector number, a segment offset, and a length uniquely identifies a compressed cache line of the shared memory cache.

9. The memory management system of claim 1, further comprising a free sector cache configured to store free memory sectors.

10. The memory management system of claim 1, wherein the physical memory has a block size of sixty-four bytes and the cache compression algorithm is a C-Pack+Z compression algorithm.

11. The memory management system of claim 1, wherein the memory manager comprises a plurality of compressors and decompressors.

12. A computerized method for tracking compressed memory, the computerized method comprising:
    accessing a sector translation table (STT) defined by a descriptor, the descriptor including a cache line map and a plurality of sector pointers pointing to sector memory;
    obtaining from the cache line map, cache line metadata relating to a cache line, the cache line metadata including one or more flags, a sector number, a cache segment length, and a length of the cache line;
    loading the cache line from physical memory into a last level cache (LLC) based on the cache line metadata, wherein a size of a compression block is the same as a size of a single cache line; and
    tracking compressed physical memory using a plurality of cache lines.

13. The computerized method of claim 12, wherein the sector memory is configured into physical memory blocks storing at least one of operating system data and application data, and further comprising receiving a real address and zeroing a plurality of least significant bits of the real address to obtain an STT entry that contains the cache line map and the plurality of sector pointers.

14. The computerized method of claim 13, wherein the plurality of sector pointers comprises four sector pointers, each sector pointer being a 4-byte field, wherein each 4-byte field is a pointer to a 512-byte memory sector that acts as storage of compressed content of the cache line, and wherein a first 48-byte area of the STT entry is the cache line map.

15. The computerized method of claim 12, further comprising organizing free memory sectors into a free sector heap, the free sector heap using the free memory sectors for storage, wherein the sector memory includes sectors storing pointers to the free memory sectors.

16. The computerized method of claim 15, further comprising caching a plurality of sectors of the free memory sectors.

17. The computerized method of claim 12, further comprising using the cache line metadata to load the cache line from physical memory into a level 3 LLC.

18. The computerized method of claim 12, wherein the physical memory has a block size of sixty-four bytes and is compressed using a cache compression algorithm.

19. One or more computer storage media having computer-executable instructions to perform memory management that, upon execution by a processor, cause the processor to at least:

access a sector translation table (STT) defined by a descriptor, the descriptor including a cache line map and a plurality of sector pointers pointing to sector memory;

obtain from the cache line map, cache line metadata relating to a cache line, the cache line metadata including one or more flags, a sector number, a cache segment length, and a length of the cache line;

load the cache line from physical memory into a last level cache (LLC) based on the cache line metadata, wherein a size of a compression block is the same as a size of a single cache line; and track compressed physical memory using a plurality of cache lines.

20. The one or more computer storage media of claim 19, wherein the computer-executable instructions, upon execution by a processor, cause the processor to further organize free memory sectors into a free sector heap, the free sector heap using the free memory sectors for storage, wherein the sector memory includes sectors storing pointers to the free memory sectors.

* * * * *